United States Patent
Pfirsch et al.

(10) Patent No.: US 9,012,311 B2
(45) Date of Patent: Apr. 21, 2015

(54) METHOD FOR PRODUCING A SEMICONDUCTOR BODY HAVING A RECOMBINATION ZONE, SEMICONDUCTOR COMPONENT HAVING A RECOMBINATION ZONE, AND METHOD FOR PRODUCING SUCH A SEMICONDUCTOR COMPONENT

(75) Inventors: Frank Pfirsch, Munich (DE); Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 694 days.

(21) Appl. No.: 12/170,470

(22) Filed: Jul. 10, 2008

(65) Prior Publication Data
US 2009/0032851 A1 Feb. 5, 2009

(30) Foreign Application Priority Data
Aug. 2, 2007 (DE) .......................... 10 2007 036 147

(51) Int. Cl.
| H01L 21/425 | (2006.01) |
| --- | --- |
| H01L 29/167 | (2006.01) |
| H01L 21/22 | (2006.01) |
| H01L 21/265 | (2006.01) |
| H01L 29/06 | (2006.01) |
| H01L 29/08 | (2006.01) |
| H01L 29/36 | (2006.01) |

(Continued)

(52) U.S. Cl.
CPC ............ *H01L 29/167* (2013.01); *H01L 21/221* (2013.01); *H01L 21/26506* (2013.01); *H01L 29/0634* (2013.01); *H01L 29/0834* (2013.01); *H01L 29/36* (2013.01); *H01L 29/66348* (2013.01); *H01L 29/7397* (2013.01); *H01L 29/7811* (2013.01); *H01L 29/8611* (2013.01)

(58) Field of Classification Search
USPC ........................... 257/610–612; 438/455, 512
See application file for complete search history.

(56) References Cited

U.S. PATENT DOCUMENTS

| 4,032,372 A | * | 6/1977 | Vora | ............................. 438/208 |
| --- | --- | --- | --- | --- |
| 5,360,752 A | * | 11/1994 | Brady et al. | .................. 438/459 |

(Continued)

FOREIGN PATENT DOCUMENTS

| DE | 3423287 A1 | 1/1985 |
| --- | --- | --- |
| DE | 4223914 C2 | 1/1996 |

OTHER PUBLICATIONS

M. Schulz, Determination of deep trap levels in silicon using ion-implantation and CV-measurements, Applied Physics A: Materials Science & Processing, vol. 4, No. 3, 225-236, 1974.*

(Continued)

*Primary Examiner* — Mark Tornow
(74) *Attorney, Agent, or Firm* — SpryIP, LLC

(57) ABSTRACT

In a method for producing a semiconductor body, impurities which act as recombination centers in the semiconductor body and form a recombination zone are introduced into the semiconductor body during the process of producing the semiconductor body. In a semiconductor component, comprising a semiconductor body having a front surface and an opposite rear surface, and also a recombination zone formed by impurities between the front and rear surfaces, wherein the impurities act as recombination centers, the surface state density at the front and rear surfaces of the semiconductor body is just as high as the surface state density at a front and rear surface of an identical semiconductor body without a recombination zone.

15 Claims, 7 Drawing Sheets

(51) Int. Cl.
*H01L 29/66* (2006.01)
*H01L 29/739* (2006.01)
*H01L 29/78* (2006.01)
*H01L 29/861* (2006.01)

(56) References Cited

U.S. PATENT DOCUMENTS

| | | | | |
|---|---|---|---|---|
| 5,372,954 | A | * | 12/1994 | Terashima .................... 438/138 |
| 5,541,122 | A | * | 7/1996 | Tu et al. ........................ 438/138 |
| 6,054,369 | A | * | 4/2000 | Neilson et al. ................ 438/455 |
| 6,198,115 | B1 | * | 3/2001 | Francis et al. ................ 257/144 |
| 6,344,092 | B1 | * | 2/2002 | Takizawa ........................ 148/33 |
| 6,528,851 | B1 | * | 3/2003 | Yu ................................. 257/347 |
| 2003/0057522 | A1 | * | 3/2003 | Francis et al. ................ 257/566 |
| 2005/0218430 | A1 | * | 10/2005 | Kelberlau ..................... 257/211 |
| 2006/0017055 | A1 | | 1/2006 | Cropper |

OTHER PUBLICATIONS

Quirk, Michael, and Julian Serda. Semiconductor Manufacturing Technology. Upper Saddle River, NJ: Prentice Hall, 2001.*
B. Jayant Baliga, Power Semiconductor Devices, Chapter 2: Transport Physics (pp. 40-65), Copyright 1996 by PWS Publishing Company, Boston, Massachusetts; 15 pages.

* cited by examiner a)

b)

METHOD FOR PRODUCING A SEMICONDUCTOR BODY HAVING A RECOMBINATION ZONE, SEMICONDUCTOR COMPONENT HAVING A RECOMBINATION ZONE, AND METHOD FOR PRODUCING SUCH A SEMICONDUCTOR COMPONENT

RELATED APPLICATION

The present application claims priority to German Application No. 10 2007 036 147 filed Aug. 2, 2007, which is incorporated by reference herein in its entirety.

BACKGROUND

Exemplary embodiments of the invention relate to a method for producing a semiconductor body having a recombination zone, to a semiconductor component having a recombination zone, and to a method for producing such a semiconductor component.

Recombination is understood to mean the coming together again of electron-hole pairs. In silicon, recombinations generally proceed by way of recombination centers. These involve contaminations of the semiconductor material which represent a defect. From an energetic standpoint, these defects lie in the forbidden band.

For some rapidly switching applications it is desirable to realize a significantly reduced carrier lifetime in the semiconductor body, in particular in the drift zone in the case of power semiconductor components, such as, for example, an IGBT or a fast freewheeling diode. This makes it possible for example to reduce the reverse current and the turn-off losses.

Previously known possibilities for reducing the carrier lifetime in such semiconductor components consist in exposing the semiconductor components to an irradiation with high-energy particles, such as electrons, for example, which bring about damage to the crystal lattice and thus the production of recombination centers. Another possibility is the indiffusion of heavy metals, such as platinum or gold, for example, from the front side of the wafer.

In both variants, however, the front side, in particular a gate oxide situated thereon, is adversely influenced by the front-side irradiation or by the diffusion from the front side. Thus, by way of example, an undesirable shift in the threshold voltage or else an instability of the electrical properties can occur.

SUMMARY

One aspect relates to a method for producing a semiconductor body, wherein impurities which act as recombination centers in the semiconductor body and form a recombination zone are introduced into a semiconductor body during the process of producing the semiconductor body.

Furthermore, another aspect relates to a semiconductor component, comprising a semiconductor body having a front surface and an opposite rear surface, and also a recombination zone formed by impurities between the front and rear surfaces, wherein the impurities act as recombination centers, and wherein the surface state density at the front and rear surfaces of the semiconductor body is just as high as the surface state density at a front and rear surface of an identical semiconductor body without a recombination zone.

Another aspect relates to a method for producing a semiconductor component, wherein a semiconductor body is produced according to the abovementioned method, a multiplicity of semiconductor component structures are formed in the semiconductor body and the semiconductor body is severed in such a way that individual semiconductor components arise.

BRIEF DESCRIPTION OF THE FIGURES

Exemplary embodiments are explained in more detail below, referring to the accompanying figures. However, the invention is not restricted to the specifically described embodiments, but rather can be modified and altered in a suitable manner. It lies within the scope of the invention to combine individual features and feature combinations of one embodiment with features and feature combinations of another embodiment in a suitable manner in order to attain further embodiments according to the invention.

Before the exemplary embodiments of the present invention are explained in more detail below with reference to the figures, it is pointed out that identical elements in the figures are provided with the same or similar reference symbols and that a repeated description of these elements is omitted. In the figures.

DETAILED DESCRIPTION

Exemplary embodiments below are concerned with a recombination zone in a semiconductor body which has no adverse surface influences.

Figure 1:
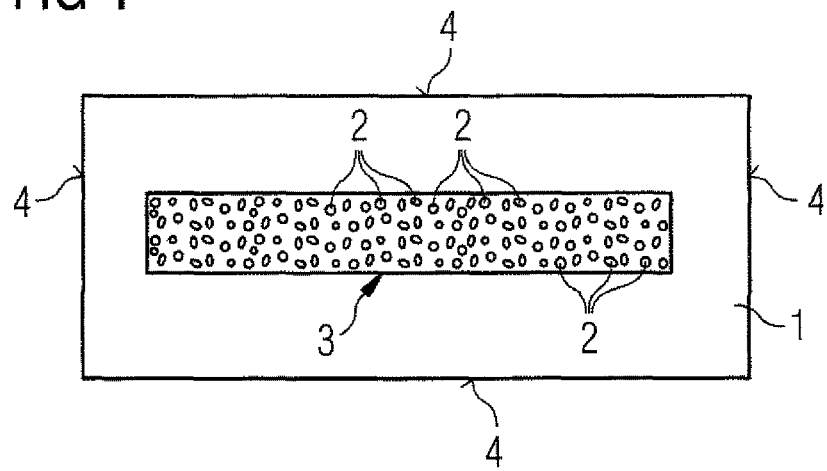
FIG. 1 shows a schematic cross-sectional view of a semiconductor body with a recombination zone.

FIG. 1 illustrates in a general form a semiconductor body 1, in which impurities 2 which act as recombination centers in the semiconductor body 1 and form a recombination zone 3 have been introduced. The impurities are introduced during the process of producing the semiconductor body 1.

The impurities 2 are introduced in the semiconductor body 1 in a locally delimited manner. Moreover, the impurities 2 are introduced into the semiconductor body 1 in such a way that an outdiffusion of the impurities from the semiconductor body in subsequent process steps does not occur. This avoids a disturbing contamination of manufacturing equipment with the impurities 2. This can be achieved for example by virtue of the fact that the impurities 2 are introduced into the semiconductor body 1 at a distance from the surfaces 4 of the semiconductor body 1.

By way of example, heavy metals, in particular tungsten or tantalum, are used as the impurities 2. In the method according to the invention, the diffusion constant of these impurities is chosen in particular such that the diffusion in the vertical wafer direction is slower than the rate of growth of the epitaxial layer, or that the diffusion of said impurities is so slow that the diffusion of said impurities as far as the semiconductor surface is avoided. The impurities 2 used have for example a diffusion constant $<10^{-13}$ cm$^2$/s, in particular a diffusion constant $<10^{-14}$ cm$^2$/s, at a temperature of 1000° C. in the semiconductor body.

Figure 2:
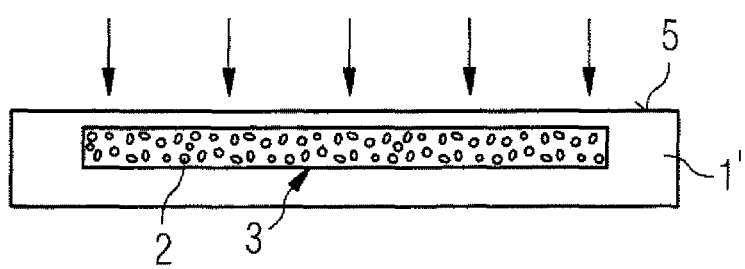
FIG. 2 shows a schematic cross-sectional view of a semiconductor body produced in two stages with a recombination zone.
Figure 2:
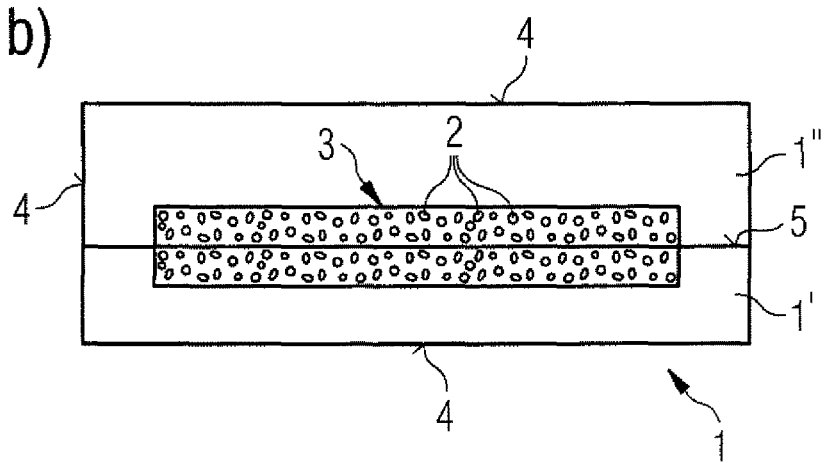

FIG. 2 illustrates a specific method for producing the semiconductor body 1 in a two-stage process. In this case, the production process comprises, as illustrated in FIG. 2a, providing a first part 1' of the semiconductor body 1. The impurities 2 are introduced in this first part 1'. This is done for example by masked implantation of the impurities 2, in particular by such a deep implantation that a liberation of the impurities 2 by outdiffusion from the semiconductor body 1 during the subsequent step of producing a second part 1" of the semiconductor body does not occur. The masking of the implantation can be effected e.g. by means of a patterned resist layer.

FIG. 2b shows the second part 1" produced on the first part 1', wherein the first part 1' and the second part 1" together form the semiconductor body 1.

The second part 1" is produced for example epitaxially on the first part 1' of the semiconductor body 1. In this case, in one embodiment, the impurities 2 can also be introduced into the part 1" by diffusion from the part 1' during the production of the second part 1" of the semiconductor body 1.

The impurities 2 diffuse on account of high temperatures in subsequent process steps in the semiconductor body 1 and form a recombination zone 3.

As shown in FIG. 2b, the recombination zone is enlarged by comparison with the original introduction zone of the impurities 2. By a suitable choice of the impurities, in particular with regard to the diffusion constant, however, the recombination zone always remains at a distance from the surfaces 4 of the semiconductor body 1, whereby an outdiffusion from the semiconductor body 1 and influencing of the surfaces 4 of the semiconductor body 1 do not occur. In particular, impurities with a lower rate of diffusion during the epitaxy process than the rate of growth of the epitaxial layer should be chosen.

Figure 3:
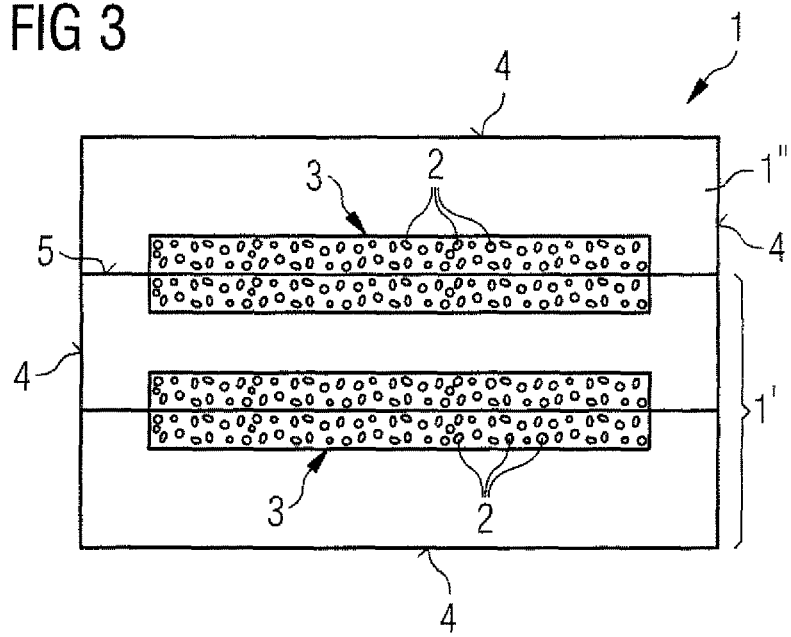
FIG. 3 shows a schematic cross-sectional view of a semiconductor body with two recombination zones.

FIG. 3 illustrates a development of the production process described with regard to FIG. 1 and FIG. 2. In this case, the method steps of producing the semiconductor body are repeated at least once. The first part 1' is thus formed by a process sequence that has already been run through once, as described with regard to FIG. 2. The semiconductor body 1 with the recombination zone 3 as described with regard to FIG. 2 is thus the first part 1' of the semiconductor body when the method steps are repeated. The second part 1" of the semiconductor body together with a further recombination zone 3 is then produced onto the surface 5 of this new first part 1' of the semiconductor body. This can be repeated as often as until the desired thickness of the semiconductor body 1 and the desired number of recombination zones 3 have been achieved. It is then made possible to establish a local distribution of the recombination zones 3 and thus also of the carrier lifetime in the vertical direction of the semiconductor body 1.

Semiconductor components are normally produced in large numbers in a semiconductor wafer in order thus to be able to produce many semiconductor components as effectively as possible in a process sequence.

Semiconductor components having a recombination zone can be produced using the method described above in which a wafer is used as the semiconductor body 1.

The wafer is therefore produced with a recombination zone 3 by means of the method steps of the method explained in more detail with reference to FIGS. 1 to 3. In addition, a multiplicity of semiconductor component structures are formed in and on the wafer and, finally, the wafer is severed in such a way that individual semiconductor components arise. Furthermore, it is possible to mask the implantation of the impurities 2 in the edge region of the semiconductor wafer in such a way that the lateral distance between the implanted layer and the edge of the semiconductor wafer is dimensioned such that the implanted impurities 2 cannot diffuse as far as towards the wafer edge during the high-temperature steps that succeed the implantation.

Semiconductor components which were produced according to this method are described by way of example below.

What is common to all the semiconductor components in this case is that a semiconductor body 10 has a front surface 40 and an opposite rear surface 41. Moreover, the semiconductor body 10 has a recombination zone 3 formed by impurities 2 between the front and rear surfaces 40, 41, wherein the impurities 2 act as recombination centers and wherein the surface state density at the front and rear surfaces 40, 41 of the semiconductor body 10 is just as high as the surface density at a front and rear surface of an identical semiconductor body without a recombination zone 3.

This means that the recombination zone 3 has no influence on the surface of the semiconductor body.

Figure 4:
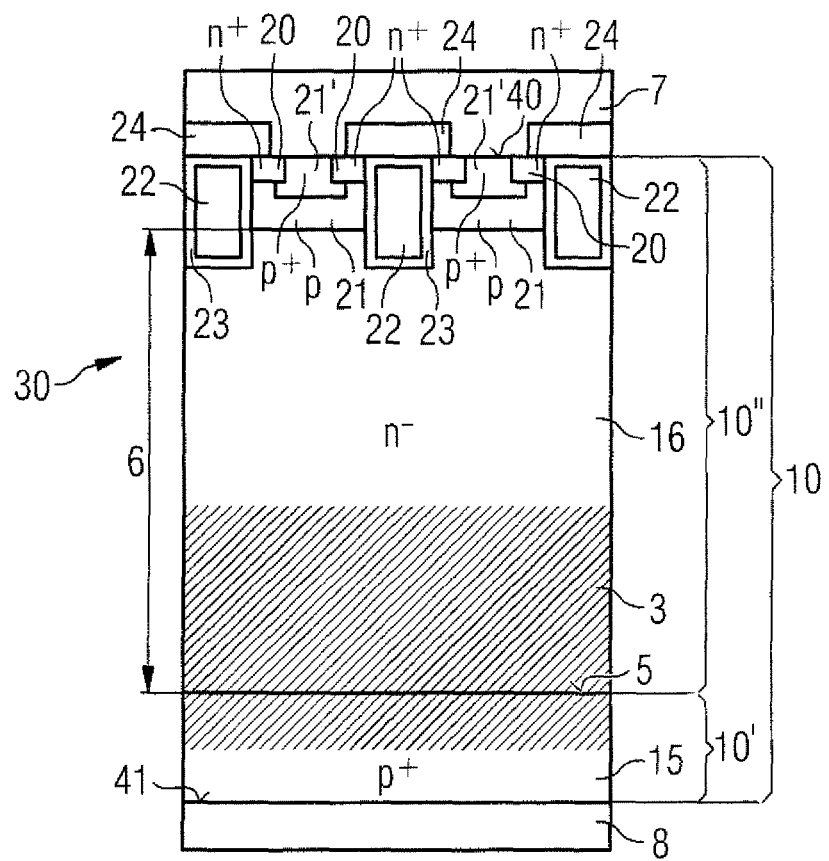
FIG. 4 shows a schematic cross-sectional view of an IGBT with a recombination zone.

FIG. 4 schematically illustrates an IGBT (Insulated Gate Bipolar Transistor) as an example of a semiconductor component.

The IGBT 30 has a semiconductor body 10 composed of a first part 10' and a second part 10".

The first part 10' of the semiconductor body 10 is formed by a highly doped p$^+$-type substrate 15, and the second part 10" is an epitaxial layer 16 produced on the p$^+$-type substrate 15.

A recombination zone 3 extends across a surface 5 of the first part 10' into the second part 10" of the semiconductor body 10, wherein a smaller part of the recombination zone 3 is situated in the first part 10' and a larger part of the recombination zone 3 is situated in the second part 10" of the semiconductor body 10. This distribution can be produced e.g. by means of the multistage epitaxy and impurity introduction as described in FIG. 3, wherein the recombination zones 3 are converted by diffusion processes into a recombination zone that is more extended in the vertical direction. In the case of a two-stage process in accordance with FIG. 2, the vertical extent of the recombination zone 3 is greater in the first part 10', in accordance with the implantation depth, by approximately double the implantation depth than in the zone 10".

The epitaxial layer 16 has, at a front surface 40 of the semiconductor body 10, first dopant regions 20 as source and second dopant regions 21 as body of a field-effect transistor. Adjoining the p-doped body region 21 and insulated from the epitaxial layer 16 by a gate oxide 23, there is a gate electrode 22 situated in a trench extending into the semiconductor body 10 from a surface 40 of the semiconductor body 10.

The gate electrode 22 permits the formation of a conducting channel in the body region 21 between the n+-doped source region 20 and a lightly n-doped drift path 6 of the epitaxial layer 16.

An insulation layer 24 is situated at the front surface 40 of the semiconductor body 10, said insulation layer having cutouts for a first electrode 7 for making contact with the source and body regions 20, 21. In this case, contact is made with the body regions 21 via a highly doped body connection zone 21' in the body region 21.

A second electrode for electrical connection of the p+-type substrate 15 is applied at a rear surface 41 of the semiconductor body 10.

The recombination zone 3 of the IGBT 30 is at a distance from the front surface 40 and in particular also from the surface of the semiconductor body 10 with respect to the gate oxide 23, such that an adverse influence with regard to the threshold voltage of the field-effect transistor is avoided.

Figure 5:
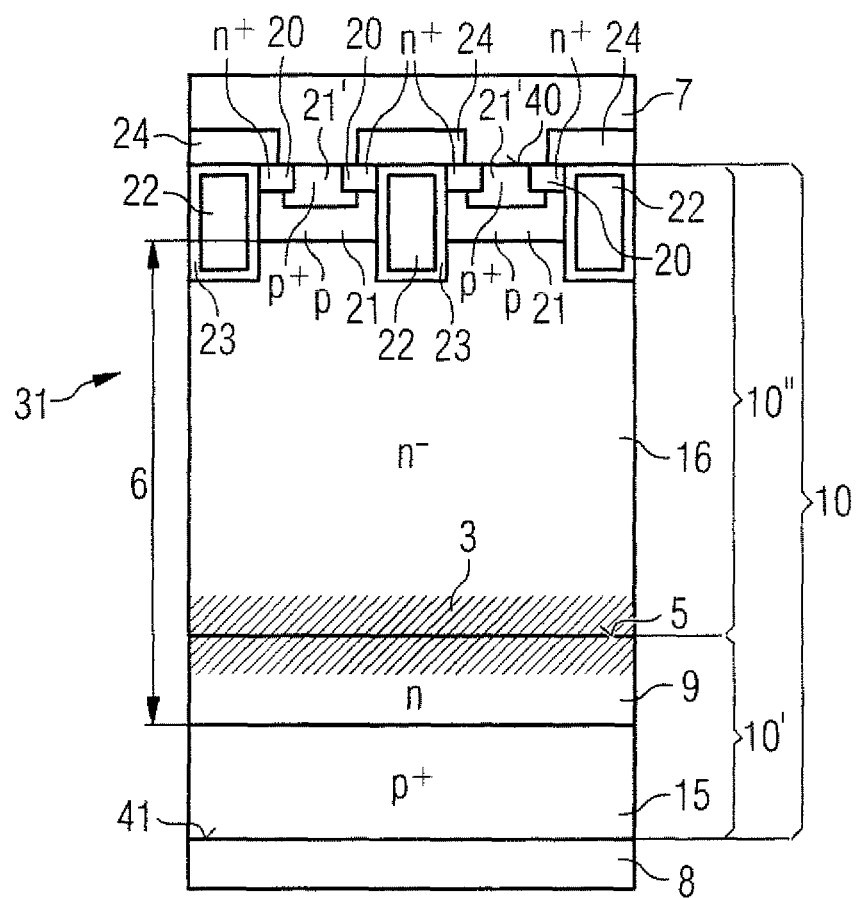
FIG. 5 shows a schematic cross-sectional view of an IGBT with a field stop layer and a recombination zone.

FIG. 5 shows an IGBT 31 slightly modified with respect to FIG. 4, this IGBT additionally having a field stop zone 9. In this exemplary embodiment, the first part 10' of the semiconductor body 10 is formed by the p+-type substrate 15 and the field stop zone 9. In this case, the field stop zone 9 is an n-doped layer produced epitaxially on the p+-type substrate 15. The recombination zone 3 extends across the surface 5 of the first part 10' of the semiconductor body 10 into the second part 10" of the semiconductor body 10. The construction of the IGBT 31 otherwise corresponds to the exemplary embodiment of the IGBT 30 from FIG. 4.

In the exemplary embodiment with regard to FIG. 5, the recombination zone 3 is produced by implantation of impurities 2 into the field stop zone 9 with subsequent diffusion. In this case, the diffusion takes place at least partly during the further epitaxial deposition of the second part 10" of the semiconductor body 10 in the direction of the p+-type substrate 15 and into the second part 10" of the semiconductor body 10.

The field stop zone 9 has a higher doping than the lightly n-doped drift path 6. The dopant concentration of the field stop zone 9 lies in the range of $1\times10^{15}$ cm$^{-3}$ to $1\times10^{18}$ cm$^{-3}$. The field stop zone 9 has a thickness in the range of 1 μm to 30 μm.

Figure 6:
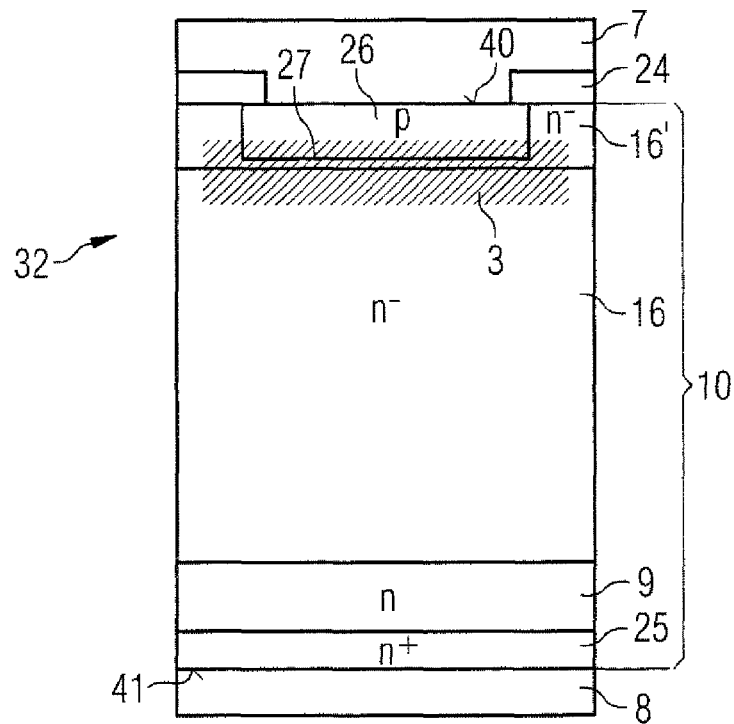
FIG. 6 shows a schematic cross-sectional view of a power diode with a recombination zone.

FIG. 6 illustrates a diode 32 as a further example of a semiconductor component with a recombination zone. The diode 32 has a semiconductor body 10 composed of a highly doped n+-type layer 25, an n-doped field stop zone 9 applied thereon and a weakly n-doped epitaxial layer 16 applied thereon with a further epitaxial layer 16' applied thereon. At a front surface 40 of the diode, a p-type well 26 is introduced in the further weakly n-doped epitaxial layer 16' and together with the n-doped further epitaxial layer 16' forms a pn junction 27 and thus represents a diode.

The p-type well 26 is connected by the first electrode 7 (anode). The first electrode 7 is applied on an insulation layer 24 on the front surface 40 of the semiconductor body 10, wherein the insulation layer 24 has a cutout above the p-type well 26, and the first electrode 7 (anode) can therefore make contact with the p-type well 26.

A second electrode 8 (cathode) for the electrical connection of the n+-type layer 25 is applied on a rear surface 41 of the semiconductor body 10.

The recombination zone 3 is situated closer to the front surface 40 than to the rear surface 41, but is at a distance from the front surface 40.

The pn junction 27 is situated at least partly within the recombination zone 3, and the recombination zone 3 is arranged at the junction between the epitaxial layer 16 and the further epitaxial layer 16'.

Figure 7:
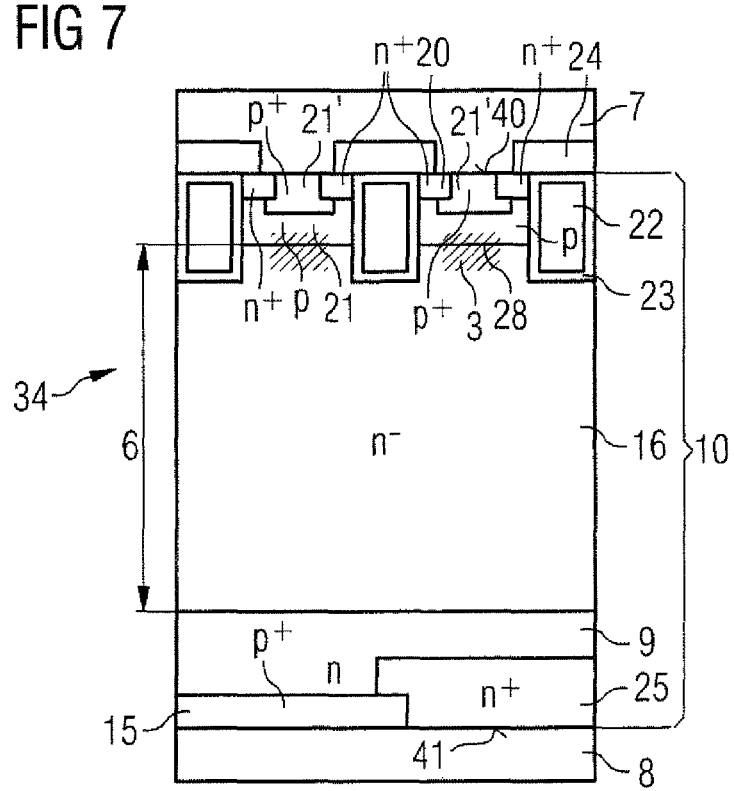
FIG. 7 shows a schematic cross-sectional view of an IGBT with a reverse conducting diode and a recombination zone.

FIG. 7 shows a reverse conducting IGBT 34, that is to say an IGBT in which a diode that conducts in the opposite current direction of the IGBT is integrated, with a recombination zone 3 as a further example of a semiconductor component.

The reverse conducting IGBT 34 is constructed similarly to the IGBT 32 described with regard to FIG. 5. In contrast to the IGBT 32 in FIG. 5, however, the reverse conducting IGBT 34 has a semiconductor body 10 which has, at the rear surface 41, at least one n+-type region 25 in the p+-type substrate 15 which is doped oppositely to the p+-type substrate 15. A field stop zone 9, a drift path 6, and also MOS field-effect transistor structures 20, 21, 22, 23 are applied in a customary manner above these alternately arranged p+-type and n+-type regions at the rear surface 41 of the semiconductor body 10. The diode that conducts in the opposite current direction of the IGBT is formed by the pn junction 28 of the body region 21 with the n-doped drift path 6. The recombination zone 3 of the reverse conducting IGBT 34 is arranged at the pn junction 28, wherein the recombination zone 3 is arranged at a distance from the gate oxide.

Figure 8:
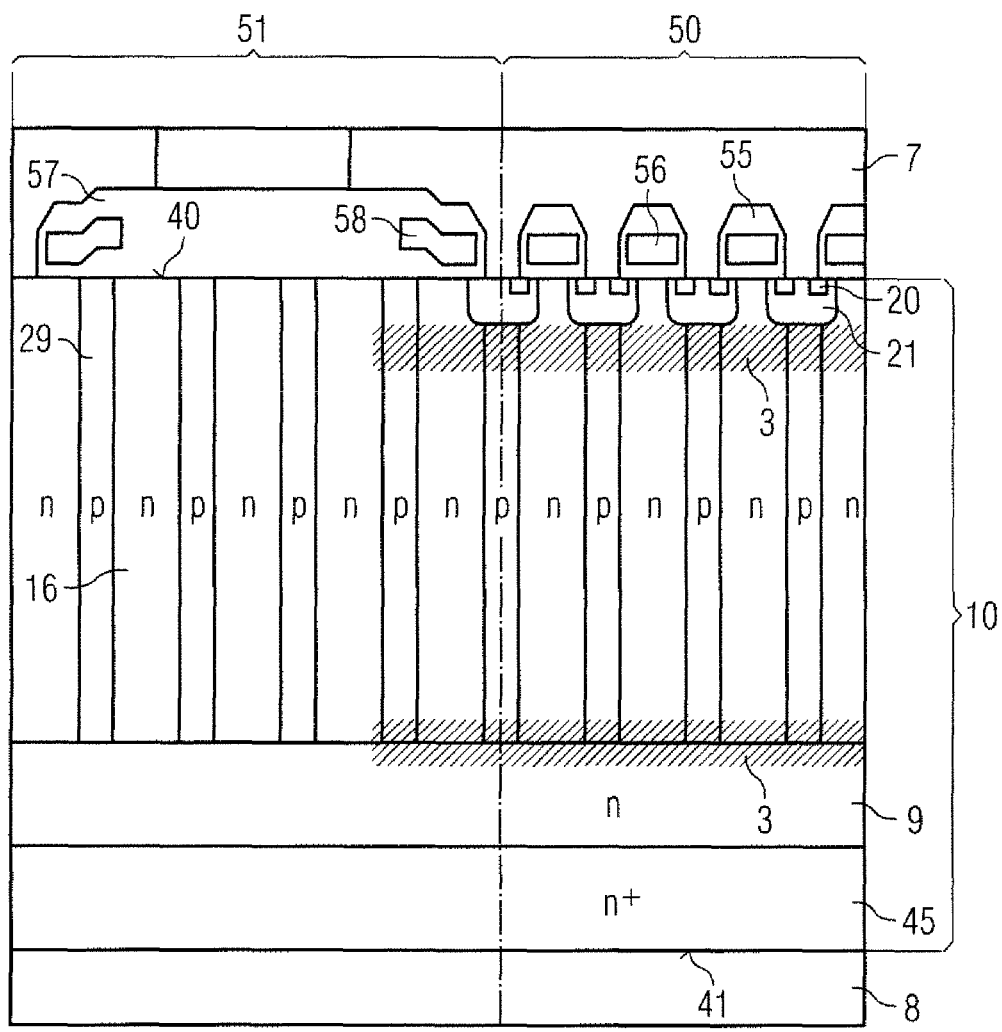
FIG. 8 shows a schematic cross-sectional view of a super-junction MOSFET with two recombination zones.

FIG. 8 illustrates a power semiconductor component with compensation structures as a further exemplary embodiment of a semiconductor component with a recombination zone 3. Such a component is also referred to as a superjunction MOSFET. The superjunction MOSFET 36 in FIG. 8 has a semiconductor body 10 composed of a substrate 45 highly doped with n-type dopant, an n-doped field stop zone 9 applied thereon, and an n-doped epitaxial layer 16 applied on the field stop zone 9. The superjunction MOSFET 36 is divided into a cell array 50 and into an adjoining edge region 51. MOSFET structures such as source regions 20 and body regions 21, for example, are situated in the cell array 50.

The n-doped epitaxial layer 16 is pervaded by p-doped pillars 29. In the edge region 51, said pillars 29 extend from the front surface 40 of the semiconductor body 10 as far as the field stop zone 9, while in the cell array 50 the pillars extend from the body region 21 to the field stop zone 9 through the epitaxial layer.

On the front surface 40 of the semiconductor body 10, gate electrodes 56 suitable for forming a channel region in the body regions 21 between the source regions 20 and the epitaxial layer 16 are arranged in insulation regions 55 in the cell array 50.

In the edge region 51, an insulation structure 57 with field plates 58 arranged therein is applied on the front surface 40 of the semiconductor body 10.

The body regions 21 and source regions 22 in the cell array are electrically connected by a metallic first electrode 7.

A second metallic electrode 8 is applied on the rear surface 41 of the semiconductor body 10.

Two recombination zones 3 are arranged within the superjunction MOSFET, wherein one recombination zone 3 is situated closer to the front surface 40 of the semiconductor body 10 below the body regions 21 in the epitaxial layer 16, while the other recombination zone 3 is situated closer to the rear surface 41 of the semiconductor body 10 and is arranged at the junction between field stop zone 9 and epitaxial layer 16. In this case, the recombination zones 3 are suitable for reducing the storage charge of the inverse diode of the superjunction MOSFET 36.

Figure 9:
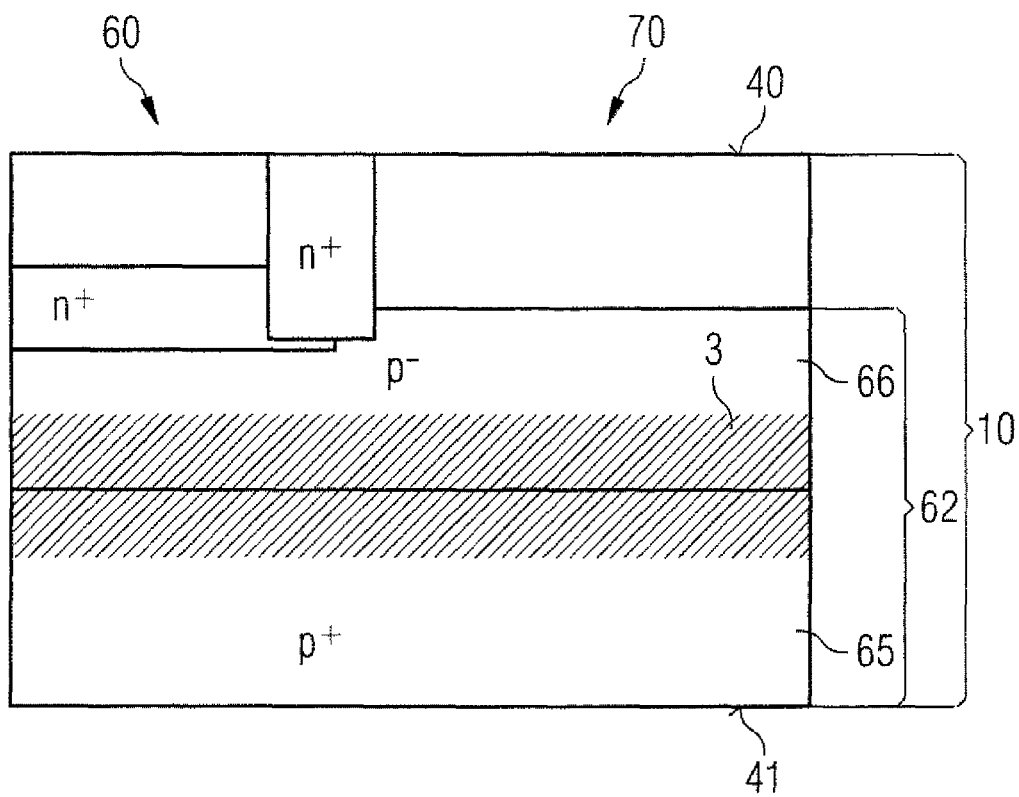
FIG. 9 shows a schematic cross-sectional view of a semiconductor device with two semiconductor components and a recombination zone.

In a further exemplary embodiment, FIG. 9 shows a recombination zone 3 in a semiconductor component using smart power technology, that is to say that the semiconductor component combines at least two different component types, for example a power transistor 60 and a logic component 70. In this case, the power transistor 60 can be a DMOS, for example, and the logic component 70 can contain transistors formed using CMOS technology.

Both component types are formed on a common p-type substrate 62 composed of a highly doped first part 65 and a weakly doped part 66 produced thereon.

The recombination zone 3 is arranged within the p-type substrate 62 at the junction between the first part 65 and the second part 66 and reduces the effects of charge carriers—injected into the p-type substrate 62—of one component on the other component.

A further exemplary embodiment of the invention is for the recombination zone 3 to be laterally subdivided into a plurality of partial regions, such that the recombination zone 3 is present with a short carrier lifetime only in parts of a semiconductor component. Such arrangements are illustrated in FIG. 6 and FIG. 8, for example, in which the recombination zones 3 were produced in such a way that they have a laterally delimited extent. Thus, it may also be desirable, for example, for a greater reduction of the charge carrier lifetime to be provided in the region of the edge termination of a blocking pn junction of a semiconductor component than in the cell array, in order thus to reduce excessive increases in the electric field strength that are produced during dynamic operation.

Figure 10:
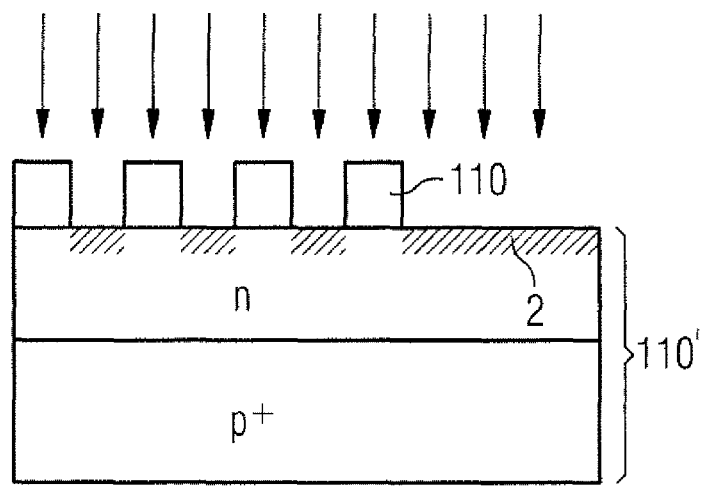
FIG. 10 shows a schematic cross-sectional view of a step of producing recombination zones that are spaced apart laterally in a semiconductor body.

One possibility for producing such a laterally locally delimited recombination zone 3 is illustrated with reference to FIG. 10. In a first part 110' of a semiconductor body 100, laterally demarcated recombination zones 3 are produced by a locally delimited implantation of the impurities 2. In this case, the locally delimited implantation is effected by means of a mask 110 having a width that is greater than double the later lateral diffusion of the impurities 2. The impurities 2 are thus introduced into a plurality of partial sections of the semiconductor body, such that regions without impurities remain between the partial sections. Afterwards, the mask 110 is removed, the semiconductor body 100 is completed by applying a second part in the manner already described, and the recombination zone 3 is formed.

Figure 11:
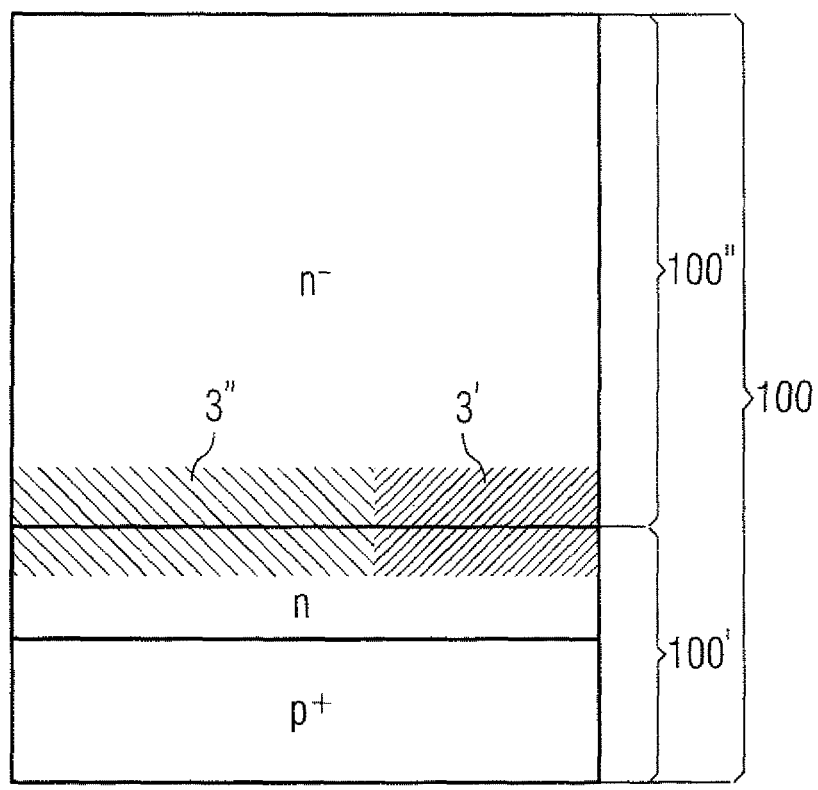
FIG. 11 shows a schematic cross-sectional view of a semiconductor body with two recombination zones having different carrier lifetimes.

By using a mask 110 having widths that are smaller than double the later lateral diffusion of the impurities, it is possible to produce contiguous regions having a carrier lifetime reduction to a lesser degree than in homogeneously implanted regions. In particular, in this way a plurality of regions having carrier lifetimes of different magnitudes can be produced in one step, as is indicated by the reference symbols 3' and 3" in FIG. 11. The regions, which are still separate after implantation, subsequently diffuse together in this case. The area portion of the regions masked by the mask 110 determines the dilution of the concentration of the impurities and thus the carrier lifetime reduction.

In all the exemplary embodiments, as a result of introducing the impurities during the process of producing the semiconductor body, an adverse influencing of the surfaces can be avoided because the impurities do not come into contact with the surfaces of the semiconductor body. A suitable measure of an uninfluenced surface is the surface state density, which, with a recombination zone present in a semiconductor component, should not be higher than in the case of a semiconductor component in which no recombination zone is present.

In general, many semiconductor components are produced with a semiconductor wafer. If the recombination zone is formed over a large area in such a wafer, a large number of semiconductor components having recombination zones can be manufactured by singulations of said semiconductor wafer in an effective form, without the recombination zones having an adverse influence on the critical surfaces of the semiconductor components.

The construction of the semiconductor body and of the dopant regions formed therein as described in the respective exemplary embodiments is intended to serve only by way of example for understanding the invention and does not restrict the invention. In particular, the dopant types chosen in the individual dopant regions are interchangeable. Moreover, the semiconductor components can be formed in a lateral as well as in a vertical embodiment without restricting the invention.

What is claimed is:

1. A method for producing a semiconductor body comprising:
   providing a first part of the semiconductor body,
   introducing impurities into the first part of the semiconductor body, wherein the impurities act as recombination centers in the semiconductor body and form a recombination zone, and wherein the impurities include at least a heavy metal, and
   epitaxially producing a second part of the semiconductor body on the first part after introducing the impurities in the first part, wherein during epitaxially producing the second part of the semiconductor body on the first part of the semiconductor body, impurities in the first part of the semiconductor body are diffused to the second part of the semiconductor body.

2. The method according to claim 1, wherein the impurities are introduced into the semiconductor body in a locally delimited manner.

3. The method according to claim 1, wherein the impurities are introduced into the semiconductor body at a distance from the surfaces of the semiconductor body.

4. The method according to claim 1, wherein the heavy metals comprise tungsten or tantalum.

5. The method according to claim 1, wherein the impurities have a diffusion constant of less than $10^{-13}$ cm$^2$/s at 1000° C. in the semiconductor body.

6. The method according to claim 1, wherein the impurities have a diffusion constant of less than $10^{-14}$ cm$^2$/s at 1000° C. in the semiconductor body.

7. The method according to claim 1, wherein the impurities are implanted.

8. The method according to claim 1, further comprising diffusing the introduced impurities in the semiconductor body during the epitaxy process, wherein the diffusion of the introduced impurities during the epitaxy process is slower than the rate of growth of the epitaxial layer.

9. The method according to claim 1, wherein the impurities are introduced into a plurality of partial sections of the semiconductor body, such that regions without impurities remain between the partial sections.

10. The method according to claim 1, wherein the method steps are repeated at least once.

11. The method according to claim 1, wherein semiconductor component structures with a drift path between a first electrode at a first surface of the semiconductor body and a second electrode at a second surface of the semiconductor body are formed in the semiconductor body.

12. The method according to claim 11, wherein the recombination zone is formed at least partly in the drift path.

13. The method according to claim 11, wherein the recombination zone is formed closer to the first electrode than to the second electrode.

14. The method according to claim 11, wherein the recombination zone is formed closer to the second electrode than to the first electrode.

15. A method for producing a semiconductor component comprising:
   providing a first part of a semiconductor body,
   introducing impurities into the first part of the semiconductor body, wherein the impurities act as recombination centers in the semiconductor body and form a recombination zone, and wherein the impurities include at least a heavy metal,
   epitaxially producing a second part of the semiconductor body on the first part after introducing the impurities in the first part, wherein during epitaxially producing the second part of the semiconductor body on the first part of the semiconductor body, impurities in the first part of the semiconductor body are diffused to the second part of the semiconductor body,
   forming a multiplicity of semiconductor component structures in the semiconductor body, and
   severing the semiconductor body in such a way that individual semiconductor components arise.

* * * * *